United States Patent
Uzoh et al.

(10) Patent No.: US 9,859,234 B2
(45) Date of Patent: Jan. 2, 2018

(54) METHODS AND STRUCTURES TO REPAIR DEVICE WARPAGE

(71) Applicant: Invensas Corporation, San Jose, CA (US)

(72) Inventors: Cyprian Emeka Uzoh, San Jose, CA (US); Guilian Gao, San Jose, CA (US); Bongsub Lee, Mountain View, CA (US); Scott McGrath, Scotts Valley, CA (US); Hong Shen, Palo Alto, CA (US); Charles G. Woychik, San Jose, CA (US); Arkalgud R. Sitaram, Cupertino, CA (US); Akash Agrawal, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/819,744

(22) Filed: Aug. 6, 2015

(65) Prior Publication Data
US 2017/0040270 A1    Feb. 9, 2017

(51) Int. Cl.
*H01L 21/00*    (2006.01)
*H01L 23/00*    (2006.01)
(Continued)

(52) U.S. Cl.
CPC ........ *H01L 24/03* (2013.01); *H01L 21/31144* (2013.01); *H01L 21/486* (2013.01);
(Continued)

(58) Field of Classification Search
CPC ......... H01L 24/03; H01L 24/05; H01L 24/13; H01L 21/31144; H01L 23/481; H01L 24/11
See application file for complete search history.

(56) References Cited

U.S. PATENT DOCUMENTS 4,742,023 A    5/1988   Hasegawa
5,284,797 A    2/1994   Heim
(Continued)

FOREIGN PATENT DOCUMENTS

TW    200721419      6/2007
TW    200901336 A    1/2009

OTHER PUBLICATIONS

International Search Report for Application No. PCT/US2012/041266 dated Oct. 19, 2012.
(Continued)

*Primary Examiner* — Richard Booth
(74) *Attorney, Agent, or Firm* — Lerner, David, Littenberg, Krumholz & Mentlik, LLP

(57) ABSTRACT

A method of processing an interconnection element can include providing a substrate element having front and rear opposite surfaces and electrically conductive structure, a first dielectric layer overlying the front surface and a plurality of conductive contacts at a first surface of the first dielectric layer, and a second dielectric layer overlying the rear surface and having a conductive element at a second surface of the second dielectric layer. The method can also include removing a portion of the second dielectric layer so as to reduce the thickness of the portion, and to provide a raised portion of the second dielectric layer having a first thickness and a lowered portion having a second thickness. The first thickness can be greater than the second thickness. At least a portion of the conductive element can be recessed below a height of the first thickness of the second dielectric layer.

12 Claims, 6 Drawing Sheets

(51) Int. Cl.
*H01L 21/311* (2006.01)
*H01L 23/48* (2006.01)
*H01L 23/498* (2006.01)
*H01L 21/48* (2006.01)
*H01L 23/532* (2006.01)

(52) U.S. Cl.
CPC ...... *H01L 23/481* (2013.01); *H01L 23/49816* (2013.01); *H01L 23/49827* (2013.01); *H01L 24/05* (2013.01); *H01L 24/11* (2013.01); *H01L 24/13* (2013.01); H01L 23/5329 (2013.01); H01L 23/53214 (2013.01); H01L 23/53228 (2013.01); H01L 23/53257 (2013.01); H01L 2224/03464 (2013.01); H01L 2224/0401 (2013.01); H01L 2224/05025 (2013.01); H01L 2224/05144 (2013.01); H01L 2224/05155 (2013.01); H01L 2224/13016 (2013.01); H01L 2224/13022 (2013.01); H01L 2924/01013 (2013.01); H01L 2924/01028 (2013.01); H01L 2924/01029 (2013.01); H01L 2924/01074 (2013.01); H01L 2924/3511 (2013.01)

(56) References Cited

U.S. PATENT DOCUMENTS

| | | | |
|---|---|---|---|
| 6,228,466 B1 | 5/2001 | Tsukada et al. | |
| 6,294,316 B1 | 9/2001 | Kaneda et al. | |
| 6,500,760 B1* | 12/2002 | Peterson | H01L 24/29 |
| | | | 257/E21.518 |
| 6,564,448 B1 | 5/2003 | Oura et al. | |
| 6,930,390 B2 | 8/2005 | Kaneda et al. | |
| 8,884,432 B2 | 11/2014 | Sakuma et al. | |
| 8,890,304 B2 | 11/2014 | Sato et al. | |
| 8,916,468 B2* | 12/2014 | Ochimizu | H01L 23/481 |
| | | | 257/E21.585 |
| 2002/0113313 A1 | 8/2002 | Kim et al. | |
| 2004/0020045 A1 | 2/2004 | Hirano | |
| 2005/0056445 A1 | 3/2005 | Orui et al. | |
| 2006/0208332 A1 | 9/2006 | Duskin et al. | |
| 2008/0112318 A1 | 5/2008 | Groleau et al. | |
| 2008/0194095 A1 | 8/2008 | Daubenspeck et al. | |
| 2009/0146316 A1 | 6/2009 | Jadhav et al. | |
| 2010/0071950 A1 | 3/2010 | Ohsumi | |
| 2011/0193230 A1 | 8/2011 | Nogami et al. | |
| 2012/0007230 A1* | 1/2012 | Hwang | H01L 24/03 |
| | | | 257/737 |
| 2012/0114004 A1 | 5/2012 | Satoh et al. | |
| 2012/0313239 A1 | 12/2012 | Zohni | |
| 2014/0084291 A1 | 3/2014 | Ye et al. | |

OTHER PUBLICATIONS

Written Opinion for Application No. PCT/US2012/041266 dated Oct. 19, 2012.
Taiwanese Office Action for Application No. 101120776 dated May 18, 2015.
International Search Report for Application No. PCT/US2016/043624 dated Oct. 20, 2016.

* cited by examiner

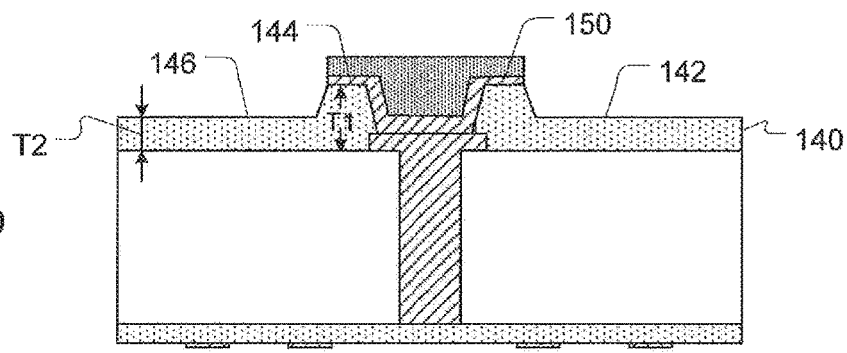
FIG. 1D
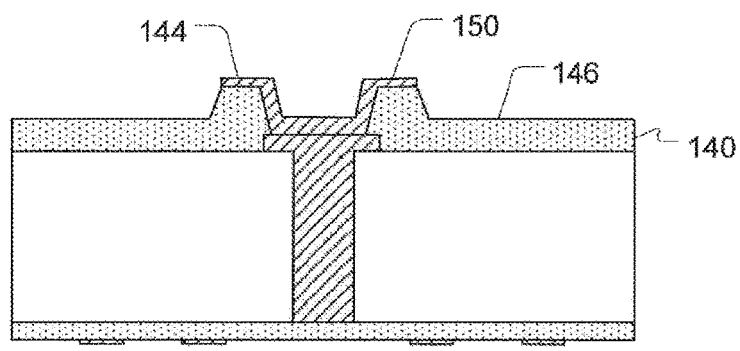
FIG. 1E
FIG. 1F
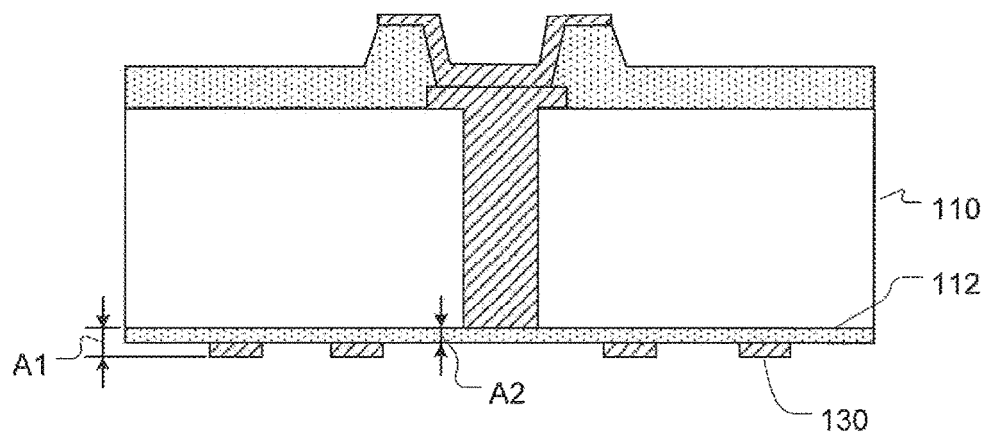

METHODS AND STRUCTURES TO REPAIR DEVICE WARPAGE

BACKGROUND OF THE INVENTION

The present invention relates to packaging of microelectronic devices and interposer structures, especially conductive interconnection structures and methods of forming such structures in semiconductor and interposer packages.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a second surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

Conventional conductive interconnection structures may have reliability challenges because of a non-optimal stress distribution radiating from such structures and a mismatch of the coefficient of thermal expansion (CTE) between a semiconductor chip, for example, and the structure to which the chip is bonded. For example, when conductive vias within a semiconductor chip are insulated by a relatively thin and stiff dielectric material, significant stresses may be present within the vias due to CTE mismatch between the conductive material of the via and the material of the substrate. In addition, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in conductive interconnection structures and methods of forming such structures in semiconductor and interposer packages, there is still a need for improvements in order to minimize the size of semiconductor chips and interposer structures, and to enhance electrical interconnection reliability.

BRIEF SUMMARY OF THE INVENTION

A method of processing an interconnection element can include providing a substrate element having front and rear opposite surfaces and electrically conductive structure, a first dielectric layer overlying the front surface and a plurality of conductive contacts at a first surface of the first dielectric layer, and a second dielectric layer overlying the rear surface and having a conductive element at a second surface of the second dielectric layer. The second dielectric layer can have a first thickness, and at least one of the conductive contacts can be electrically coupled with the conductive element through the electrically conductive structure.

The method can also include removing a portion of the second dielectric layer so as to reduce the thickness of the portion to a second thickness, and to provide a raised portion of the second dielectric layer having the first thickness and a lowered portion having the second thickness. The first thickness can be greater than the second thickness. At least a portion of the conductive element can be recessed below a height of the first thickness of the second dielectric layer.

Another method of processing an interconnection element can include providing a substrate element having a surface, a dielectric layer overlying the surface and having a first thickness, and a conductive element adjacent and at least partially overlying the dielectric layer, and removing a portion of the dielectric layer adjacent the conductive element so as to reduce the thickness of a portion of the dielectric layer to a second thickness. At least a portion of the conductive element can extend below a height of the first thickness of the dielectric layer.

In a particular embodiment, the removing can form a raised portion of the dielectric layer having the first thickness and a lowered portion having the second thickness. In one example, the surface can be a rear surface of the substrate element, the substrate element can have a front surface opposite the rear surface, and the substrate element can have electrically conductive structure. The dielectric layer can be a second dielectric layer, the substrate element can have a first dielectric layer overlying the front surface and a plurality of conductive contacts at a first surface of the first dielectric layer, the conductive element can be at a second surface of the second dielectric layer, and at least one of the conductive contacts can be electrically coupled with the conductive element through the electrically conductive structure.

In an exemplary embodiment, the method can also include, before the removing, providing a mask covering at least a portion of the conductive element. The portion of the dielectric layer can be exposed by the mask, and the removing can include etching the portion of the dielectric layer exposed by the mask. In a particular example, the removing can include etching the dielectric layer using the conductive element as a mask overlying covered locations of the dielectric layer, so as to form the raised portion at the covered locations in alignment with the conductive element.

In one embodiment, the dielectric layer can define a recess extending from a surface of the raised portion of the dielectric layer toward the rear surface, and the conductive element can be located within the recess and extending onto the raised portion, and the conductive element may not contact the lowered portion. In a particular embodiment, the substrate element can have a through opening extending between the front and rear surfaces, and the electrically conductive structure can include a conductive via extending within the opening. In one example, the substrate element can have a first coefficient of thermal expansion ("CTE") in a plane parallel to the rear surface of less than 8 ppm/° C., and the dielectric layer can have a second CTE in a plane parallel to the rear surface of greater than 12 ppm/° C.

In an exemplary embodiment, the method can also include providing an electrically conductive bond material on the portion of the conductive element that extends below the height of the first thickness of the dielectric layer. In a particular example, the plurality of conductive contacts can extend a first distance above the front surface. The method can also include removing a portion of the first dielectric layer so that a portion of the first surface is lowered to a second distance above the front surface, the first distance being greater than the second distance.

In one embodiment, the method can also include juxtaposing element contacts at a face of a microelectronic element with the plurality of conductive contacts, and joining the element contacts with the conductive contacts. In a particular embodiment, the electrically conductive structure can include one or more electrically conductive traces underlying at least part of the raised portion of the second dielectric layer, the electrically conductive structure coupled with the conductive element. In one example, the second thickness can be zero.

Yet another method of processing an interconnection element can include providing a substrate element having front and rear opposite surfaces and electrically conductive structure, a first dielectric layer overlying the front surface and a plurality of conductive contacts at a first surface of the first dielectric layer, and a second dielectric layer overlying the rear surface and having a second surface, the second dielectric layer having a first thickness.

The method can also include removing a portion of the second dielectric layer so as to reduce the thickness of the portion to a second thickness, and to provide a raised portion of the second dielectric layer having the first thickness, the first thickness being greater than the second thickness, the removing comprising forming a recess within the second dielectric layer extending from the raised portion of the second surface toward the rear surface. The method can further include then forming a conductive element in the recess, the conductive element electrically coupled with the electrically conductive structure.

In an exemplary embodiment, the conductive element may be formed only within the recess. In a particular example, the method can also include, before forming the conductive element, applying an electroless nickel immersion gold coating within the recess. The conductive element can be formed on the coating. In one embodiment, the method can also include, before the removing, depositing a first dielectric mask overlying covered locations of the second dielectric layer. The removing can include etching the portion of the second dielectric layer, the portion of the second dielectric layer being exposed by the first dielectric mask.

In a particular embodiment, the substrate element can have a through opening extending between the front and rear surfaces, and the electrically conductive structure can include a conductive via extending within the opening, and the removing exposes a top surface of the conductive via within the recess. In one example, the method can also include, before depositing the first dielectric mask, depositing a second dielectric mask on at least a portion of the top surface of the conductive via. The second dielectric mask can include a different material than the first dielectric mask.

An interconnection element can include a substrate element consisting essentially of at least one of dielectric or semiconductor material, the substrate element having a surface, and a dielectric layer overlying the surface, and a conductive element at the dielectric layer. The dielectric layer can have a raised portion at a raised height above the rear surface having a first thickness, and a lowered portion at a lowered height above the rear surface having a second thickness, the first thickness being greater than the second thickness. At least a portion of the conductive element can be recessed below a height of the first thickness of the dielectric layer. The conductive element can be wettable by a bond material.

In an exemplary embodiment, the raised portion can be flat and the raised height can be a constant raised height above the surface, and the lowered portion can be flat and the lowered height can be a constant lowered height above the surface. In a particular example, the surface can be a rear surface and the substrate element can have a front surface opposite the front surface. The dielectric layer can be a second dielectric layer. The interconnection element can also include a first dielectric layer overlying the front surface and having a first surface, and a plurality of conductive contacts at the first surface. The conductive element can be electrically coupled with the contacts by electrically conductive structure between the front and rear surfaces.

In one embodiment, the at least a portion of the conductive element can be a first portion, and at least a second portion of the conductive element can overlie the raised portion of the dielectric layer. In a particular embodiment, the interconnection element can also include an electrically conductive bond material extending onto both the first and second portions of the conductive element. In one example, the conductive element can be entirely recessed below the height of the first thickness of the dielectric layer.

In an exemplary embodiment, the electrically conductive structure can include one or more electrically conductive traces underlying at least part of the raised portion of the second dielectric layer. In a particular example, the second thickness can be is zero. In one embodiment, the substrate element can define a thickness of 200 microns or less. In a particular embodiment, a system can include the interconnection element as described above and one or more other electronic components electrically connected with the interconnection element. In one example, the system can also include a housing, the interconnection element and the one or more other electronic components being assembled with the housing.

BRIEF DESCRIPTION OF THE DRAWINGS

FIGS. 1B-1F are side sectional views illustrating stages of fabrication in accordance with the embodiment depicted in FIG. 1A.

DETAILED DESCRIPTION

As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate. As used herein, a statement that one surface or element is located at a "constant" height above or below another surface or element means constant within manufacturing tolerances, e.g., ±10% over the area of a completed single interconnection element. As used herein, the term "about" with respect to a given numerical value means that the actual value is within a typical manufacturing tolerance known to one skilled in the relevant art of the given numerical value.

Figure 1A:
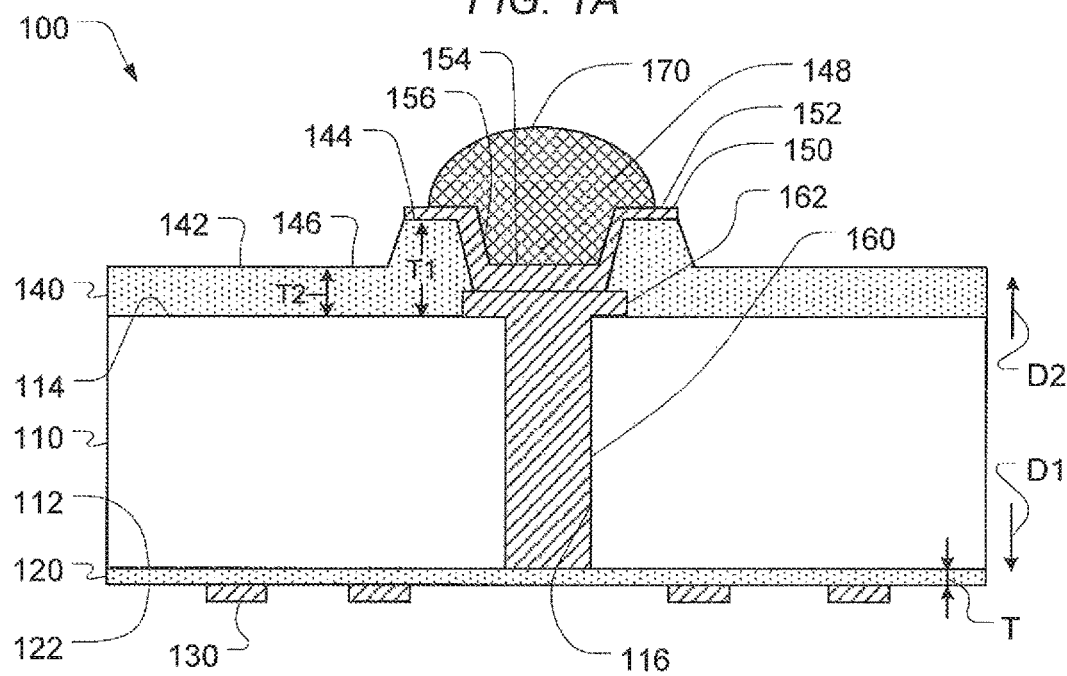
FIG. 1A is a side sectional view illustrating an interconnection element in accordance with an embodiment of the invention.

As illustrated in FIG. 1A, an interconnection element 100 can include a substrate element 110 having a front surface 112 and a rear surface 114 opposite from the front surface. The interconnection element 100 can also include a first dielectric layer 120 overlying the front surface 112 and having a first surface 122 and a plurality of conductive contacts 130 at the first surface, and a second dielectric layer 140 overlying the rear surface 114 and having a second surface 142 and a conductive element 150 at the second surface. The interconnection element 100 can also include electrically conductive structure between the front and rear surfaces 112, 114, shown in FIG. 1A in the form of a conductive via 160, which can electrically couple the conductive element 150 with one or more of the contacts 130. In the embodiment of FIG. 1A, the conductive via 160 can extend within a through opening 116 extending between the front and rear surfaces 112, 114.

In FIG. 1A, the directions parallel to the front and rear surfaces 112, 114 of the substrate element 110 are referred to herein as "horizontal" or "lateral" directions, whereas the directions perpendicular to the front and rear surfaces are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The substrate element 110 can consist essentially of at least one of dielectric or semiconductor material. For example, in some embodiments, the substrate element 110 can consist essentially of semiconductor material, such as silicon. The substrate element 110 can have a coefficient of thermal expansion ("CTE") less than 10 parts per million per degree Centigrade in a plane of the substrate ("ppm/° C."). In a particular embodiment, the substrate element 110 can have a CTE less than 7 ppm/° C. In one example, a plurality of active semiconductor devices (e.g., transistors, diodes, etc.) can be disposed in an active semiconductor region thereof located at and/or below the front surface 112 and/or the rear surface 114. The thickness of the substrate element 110 between its front and rear surfaces 112, 114 can be less than 500 μm, and can be significantly smaller, for example, less than 200 μm, 130 μm, 70 μm or even smaller.

In some embodiments, the substrate element 110 can be made from a dielectric material such as ceramic, glass, liquid crystal material, a composite material such as glass-epoxy or a fiber-reinforced composite, a laminate structure, or a combination thereof. In some embodiments, the substrate element 110 can be a supporting dielectric element, e.g., a tape used in tape automated bonding ("TAB"). In one example, the substrate element 110 can consist essentially of a dielectric element having a coefficient of thermal expansion in a plane of the substrate of less than 10 ppm/° C. In a particular embodiment, the substrate element 110 can consist essentially of a dielectric element having a coefficient of thermal expansion in a plane of the substrate of between about 10 and about 20 ppm/° C.

The first dielectric layer 120 can overlie the front surface 112 of the substrate element 110. The first dielectric layer 120 can define a first surface 122 that generally faces in a first direction D1 that is perpendicular to front surface 112. The first dielectric layer 120 can have a plurality of conductive contacts 130 at the first surface 122. The conductive contacts 130 can be configured to be joined with corresponding element contacts of a microelectronic element or another external component. In some embodiments, the conductive contacts 130 can each be a thin, flat pad of metal, such as copper or aluminum. The first dielectric layer 120 can have a relatively uniform thickness T between the first surface 122 and the front surface 112.

Figure 1B:
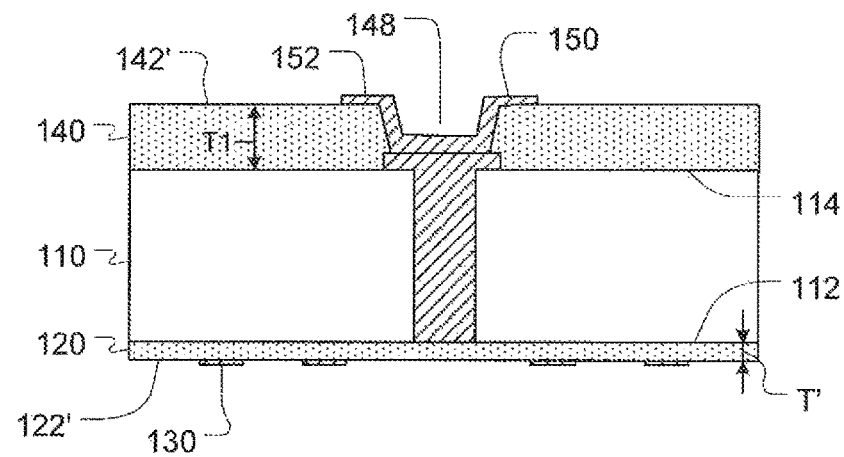
Figure 1C:
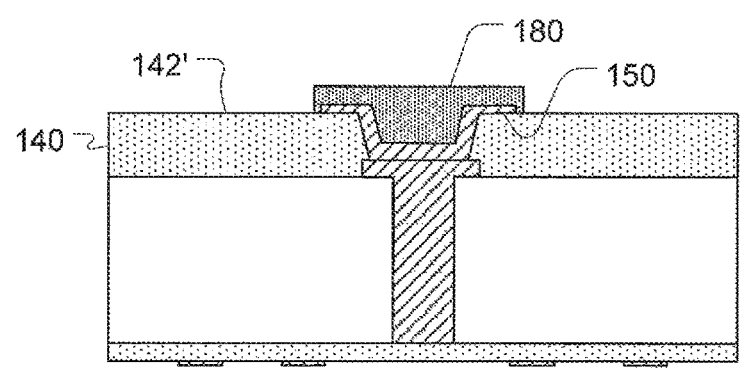
Figure 1G:
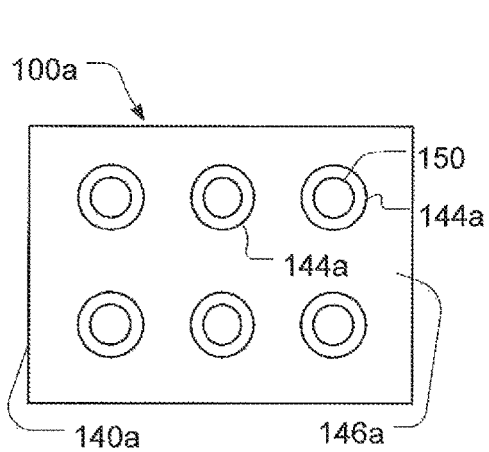
FIGS. 1G and 1H are two potential alternative top plan views that each may correspond to the side sectional view of FIG. 1A.
Figure 1H:
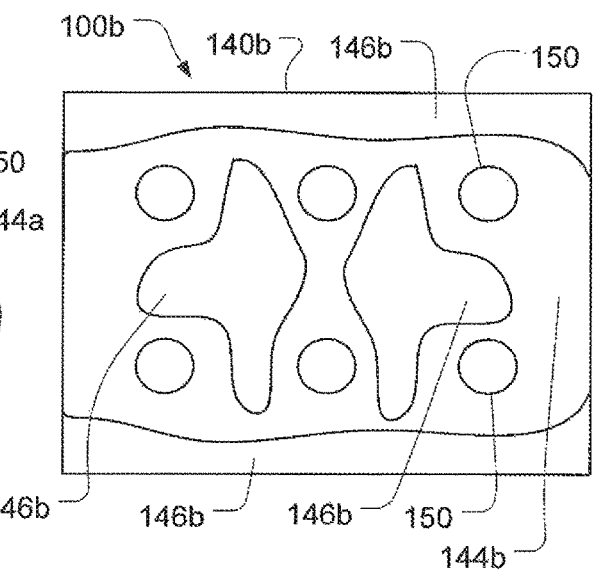

Although only a single conductive via 160 and only a single conductive element 150 is shown and described with reference to FIG. 1A, it is to be understood that the interconnection element 100 can include a plurality of conductive vias and conductive elements (as seen in FIGS. 1G and 1H), for example, an m×n array of conductive vias and conductive elements, one or both of m and n being greater than one. The conductive contacts 130, the conductive element 150, and the conductive via 160 may be used, for example, to carry signals or information, power, or a reference potential between the front and rear surfaces 112, 114 of the substrate element 110.

The first dielectric layer 120 can be a redistribution layer including one or more conductor layers extending within dielectric material, the conductor layers providing an electrical connection between the conductive via 160 and one or more of the conductive contacts 130. The first dielectric layer 120 can be an insulating dielectric layer that can electrically insulate conductive elements such as the conductive contacts 130 and the conductive via 160 from the substrate, when the substrate comprises an electrically conductive material or a semiconductor material.

In some embodiments, the first dielectric layer 120 can be referred to as a "passivation layer" of the substrate element 110. Such a dielectric layer can include an inorganic or organic dielectric material or both. In one example, the first dielectric layer 120 can comprise silicon dioxide. Such a dielectric layer can include an electrodeposited conformal coating or other dielectric material, for example, a photoimageable polymeric material, for example, a solder mask material. In one example, the first dielectric layer 120 can have a thickness between about 0.5 microns and about 3.0 microns. In another example, the first dielectric layer 120 can have a thickness of less than about 0.5 microns (i.e., less than 500 nanometers). In another example, the first dielectric layer 120 can have a thickness of less than about 1 micron.

The second dielectric layer 140 can overlie the rear surface 114 of the substrate element 110. The second dielectric layer 140 can define a second surface 142 that generally faces in a second direction D2 opposite the first direction D1, the second direction being perpendicular to the rear surface 114. The second dielectric layer 140 can have a conductive element 150 at the second surface 142, as shown in FIG. 1A, or plurality or m×n array of conductive elements 150 at the second surface, as can be seen in FIGS. 1G and 1H.

The conductive elements 150 can be configured to be joined with corresponding contacts of a circuit panel (e.g., a module card, motherboard, etc.) or another external component. The interconnection element 100 can include an electrically conductive bond material 170 in contact with a surface of one or more of the conductive elements 150, to join the conductive elements with such corresponding contacts of a circuit panel or another external component. The conductive elements 150 can be wettable by the conductive bond material 170.

The conductive bond material 170 can be, for example, masses of a bond metal such as solder, tin, indium, gold, a eutectic composition or combination thereof, or another joining material such as a conductive paste or a conductive adhesive. In a particular embodiment, the conductive bond material 170 can include an electrically conductive matrix material such as described in U.S. patent application Ser. Nos. 13/155,719 and 13/158,797, the disclosures of which are hereby incorporated herein by reference. In a particular embodiment, the conductive bond material 170 can have a similar structure or be formed in a manner as described therein. In some examples, suitable materials for the conductive bond material 170 can include polymers filled with conductive material in particle form such as metal-filled polymers, including, for example, metal-filled epoxy, metal-filled thermosetting polymers, metal-filled thermoplastic polymers, or electrically conductive inks.

The second dielectric layer 140 can be an insulating dielectric layer that can electrically insulate conductive elements such as the conductive element 150 and the conductive via 160 from the substrate, when the substrate comprises an electrically conductive material or a semiconductor material.

The second dielectric layer 140 can include an inorganic or organic dielectric material or both. In one example, the second dielectric layer 140 can comprise polyamide or polyimide. Such a dielectric layer can include an electrodeposited conformal coating or other dielectric material, for example, a photoimageable polymeric material, for example, a solder mask material.

In one example, the second dielectric layer 140 can have a thickness between about 3 microns and about 10 microns. In a particular embodiment, the second dielectric layer can have a CTE in a horizontal plane of the substrate element 110 parallel to the rear surface 114 between about 3 ppm/° C. and about 20 ppm/° C. In another example, the second dielectric layer 140 can be an anisitropic dielectric, having a CTE in a horizontal plane of the substrate element 110 parallel to the rear surface 114 between about 3 ppm/° C. and about 20 ppm/° C., and a CTE in a vertical plane of the substrate element perpendicular to the rear surface between about 40 ppm/° C. and about 100 ppm/° C. In one embodiment, the second dielectric layer 140 can comprise a first dielectric material and can have a particulate of a second material distributed therein different from the first material to vary the CTE and/or hardness of the dielectric layer.

As can be seen in FIG. 1A, the second dielectric layer 140 can have a raised portion 144 having a first thickness T1 between the second surface 142 and the rear surface 114, and a lowered portion 146 having a second thickness T2 between the second surface and the rear surface, the first thickness being greater than the second thickness. In one example, T1 can be about 5 microns, and T2 can be about 2 microns. In another example, T1 can be between about 3 microns and about 10 microns, and T2 can be between about 0.5 microns and about 4 microns, with T1 being greater than T2. In one example, T1 can be between about 3 microns and about 10 microns, and T2 can be about half the thickness of T1. In a particular embodiment, T2 can be about half or less than about half of the thickness of T1.

The second dielectric layer 140 can define a recess 148 extending below the surface of the raised portion 144, from the second surface 142 toward the rear surface 114. As can be seen in FIG. 1A, the recess 148 may extend completely through the second dielectric layer 144, such that a contact portion 162 coupled to the electrically conductive via 160 at the rear surface 114 is exposed within the recess.

The inventors have found that reducing the thickness of some portions of the second dielectric layer 140 of the interconnection element 100 may reduce warpage of the interconnection element in use, particularly when the CTE of the second dielectric layer is significantly greater than the CTE of the substrate element 110. For example, in one embodiment, the CTE of the substrate element 100 in a plane parallel to the rear surface 114 can be less than 8 ppm/° C., and the CTE of the second dielectric layer 140 in a plane parallel to the second surface 142 can be greater than 12 ppm/° C. This effect may be particularly significant when the substrate element 110 is thin, i.e., less than 200 microns, and the dielectric material of the second dielectric layer 140 is somewhat rigid. This potential advantage of reduced warpage from reducing the thickness of some portions of the second dielectric layer also may be realized in the embodiment of FIG. 2A that will be described below.

The above potential advantages can also apply to embodiments in which two or more interconnection elements 100 are joined with one another in a stacked configuration. For example, a first interconnection element can be joined with a second interconnection element with confronting conductive elements 150 of each interconnection element joined to one another through the conductive bond material 170. In such a stacked assembly of interconnection elements 100, reliability of the electrical connection between the conductive elements 150 can be improved compared to conventional interconnection elements, for example, due to the reduced thickness of some portions of the second dielectric layer 140 of one or both of the interconnection elements 100.

Such joined interconnection elements 100 can be joined with the front surfaces 112 confronting one another, the rear surfaces 114 confronting one another, or the front surface of a first interconnection element confronting the rear surface of another interconnection element. The electrical connection between conductive elements of such joined interconnection elements 100 can be through one or more of flip-chip joining, wire bond joining, and direct metal-to-metal conductive element joining.

In one embodiment, the second thickness T2 can be zero, such that the second dielectric layer 140 has an opening extending therethrough between a first raised portion 144 and a second raised portion spaced apart from the first raised portion. In such an embodiment, the raised portions 144 can be a plurality of spaced-apart discontinuous portions of the second dielectric layer 140, rather than raised portions of a continuous second dielectric layer.

As shown in FIG. 1A, the conductive element 150 can have a recessed portion 154 located within the recess 148, which is recessed below a height of the first thickness of the second dielectric layer. The conductive element 150 can extend onto the raised portion 144. For example, a high portion 152 of the conductive element 150 can overlie the raised portion 144 of the second dielectric layer 140. The high portion 152 may have a ring shape, for example. In one embodiment, the recessed portion 154 of the conductive element 150 can overlie the contact portion 162 coupled to the electrically conductive via 160. The recessed portion 154 may have a circular shape, for example. The high portion 152 and the recessed portion 154 of the conductive element 150 can be connected by a transition portion 156, which may have a frusto-conical shape, for example. In the embodiment of FIG. 1A, the conductive element 150 does not contact the lowered portion 146 of the second conductive layer 140.

The conductive via 160 or other electrically conductive structure between the front and rear surfaces 112, 114 can include a metal such as copper, aluminum, tungsten, an alloy including copper, an alloy including nickel, or an alloy including tungsten, among others. In one example, the conductive via 160 can consist essentially of copper.

Although the electrically conductive structure that can electrically couple the conductive element 140 with one or more of the contacts 130 is shown in FIG. 1A in the form of an electrically conductive via 160 having a contact portion 162 at the rear surface 114 exposed within the recess 148, that need not be the case. In other embodiments, the electrically conductive structure that can electrically couple the conductive element 140 with one or more of the contacts 130 can include one or more electrically conductive traces underlying at least part of the raised portion 144 of the second dielectric layer 140.

A method of fabricating the interconnection element 100 (FIG. 1A) will now be described, with reference to FIGS. 1B through 1F. As illustrated in FIG. 1B, the substrate element 110 can initially be provided with a second dielectric layer 140 having a generally uniform initial second surface 142' having an initial thickness T1 between the second surface and the rear surface 114, except at locations where recess 148 have been formed. The substrate element 110 can initially be provided with a first dielectric layer 120 having an initial first surface 122' having an initial thickness T' between the first surface and the front surface 112, T' being thicker than the thickness T shown in FIG. 1A. The high portion 152 of the conductive element 150 can overlie a portion of the initial second surface 142' the second dielectric layer 140 adjacent the recess 148.

As can be seen in FIG. 1C, a mask 180 can be provided overlying the conductive element 150. In one embodiment, the mask may be a reusable contact mask, such as commonly made of metal. In another embodiment, the mask may be a protective dielectric mask that can be formed at specific locations. For example, a photoimageable layer, e.g., a photoresist layer, can be deposited and patterned to cover only portions of the initial second surface 142' of the second dielectric layer 140. The dielectric mask 180 may protect the conductive element 150 from being damaged during removal of portions of the second dielectric layer 140.

Referring to FIG. 1D, a portion of the second dielectric layer 140 can be removed at locations not covered (i.e., exposed) by the mask 180, so as to reduce the thickness of the portion to the second thickness T2, and to provide the raised portion 144 of the second dielectric layer having the first thickness T1 and the lowered portion 146 having the second thickness T2, the first thickness being greater than the second thickness. The removing of the portion of the second dielectric layer 140 can include etching the portion of the second dielectric layer to be removed. In one example, the removing of the portion of the second dielectric layer 140 can be performed by isotropic etching. As shown in FIG. 1E, after the raised portion 144 and the lowered portion 146 of the second dielectric layer 140 are defined by this process, the mask 180 can be removed.

As mentioned above, in some embodiments, removal of one or more portions of the second dielectric layer 140 can be performed such that the second thickness T2 is zero, and the second dielectric layer 140 has an opening extending through its entire thickness. In this way, a first raised portion 144 and a second raised portion 144 are spaced apart from one another with the opening between them. In such an embodiment, the raised portions 144 can be a plurality of spaced-apart discontinuous portions of the second dielectric layer 140, rather than raised portions of a continuous second dielectric layer.

In a variation of the portion of the method shown in FIGS. 1C-1E, the mask 180 can be omitted. In this variation, the conductive element 150 can serve as a mask overlying covered locations of the initial second surface 142' of the second dielectric layer 140, so as to reduce the thickness of portions of the second dielectric layer not covered by the conductive element to the second thickness T2, and to provide the raised portion 144 of the second dielectric layer having the first thickness T1 and the lowered portion 146 having the second thickness T2. In this variation, the raised portion 144 can be formed at the covered locations of the initial second surface 142' in alignment with the conductive element 150. In one example of this variation, the removing of the portion of the second dielectric layer 140 can be performed by anisotropic etching.

As can be seen in FIG. 1F, a portion of the first dielectric layer 120 can be removed, so as to reduce the thickness of the first dielectric layer from its initial thickness T' (FIG. 1B) between an initial first surface 122' and the front surface 112 of the substrate element 110 to a reduced thickness T (FIG. 1F) between a reduced first surface 122 and the front surface.

The reduced thickness of the first dielectric layer 120 can have the effect of exposing more of the thickness of the plurality of conductive contacts 130 at the first surface 122. For example, the plurality of conductive contacts 130 can extend a first distance A1 above the front surface 112, and after the portion of the first dielectric layer 120 is removed, a portion of the first surface 122 is lowered to a second distance A2 above the front surface, the first distance being greater than the second distance.

Referring again to FIG. 1A, the electrically conductive bond material 170 can be provided in the recess 148 extending below the raised portion 144 of the second dielectric layer 140. In the embodiment shown in FIG. 1A, the conductive bond material 170 can be provided such that it does not contact the lowered portion 146 of the second dielectric layer 160. Finally, if desired, at least some of the plurality of conductive contacts 130 may be joined with element contacts at a face of a microelectronic element (not shown).

The inventors have found that keeping the electrically conductive bond material 170 contained within the raised portion 144 of the second dielectric layer may permit the use of a smaller volume of the bond material, and as a result, a smaller pitch (i.e., closer distance) between adjacent ones of the conductive elements 150 may be possible because of the lateral containment of the bond material. This potential advantage of containment of the conductive bond material also may be realized in the embodiment of FIG. 2A that will be described below.

FIGS. 1G and 1H are two potential alternative top plan views that each can correspond to the side sectional view of FIG. 1A. In the example shown in FIG. 1G, the second dielectric layer 140a of an interconnection element 100a can include a plurality of spaced-apart raised portions 144a, each underlying a portion of a corresponding conductive element 150, with a lowered portion 146a extending between adjacent ones of the raised portions. As indicated above, the lowered portion may have a thickness T2 of zero in one example, or a constant thickness T2 that is a percentage, e.g., 5% to 95%, of the thickness T1 of the raised portions 144a.

In the alternative example shown in FIG. 1H, the second dielectric layer 140b of an interconnection element 100b can include one or more raised portions 144b that continuously extend between at least two adjacent ones of the conductive elements 150. At least some adjacent ones of the conductive elements 150 can be separated by a lowered portion 146b. As can be seen in FIG. 1H, the interconnection element 100b may have a plurality of spaced-apart lowered portions 146b extending within a continuous raised portion 144b. Again, the lowered portions 146b can have a thickness T2 of zero or a constant thickness T2 that is a percentage of T1.

Figure 2A:
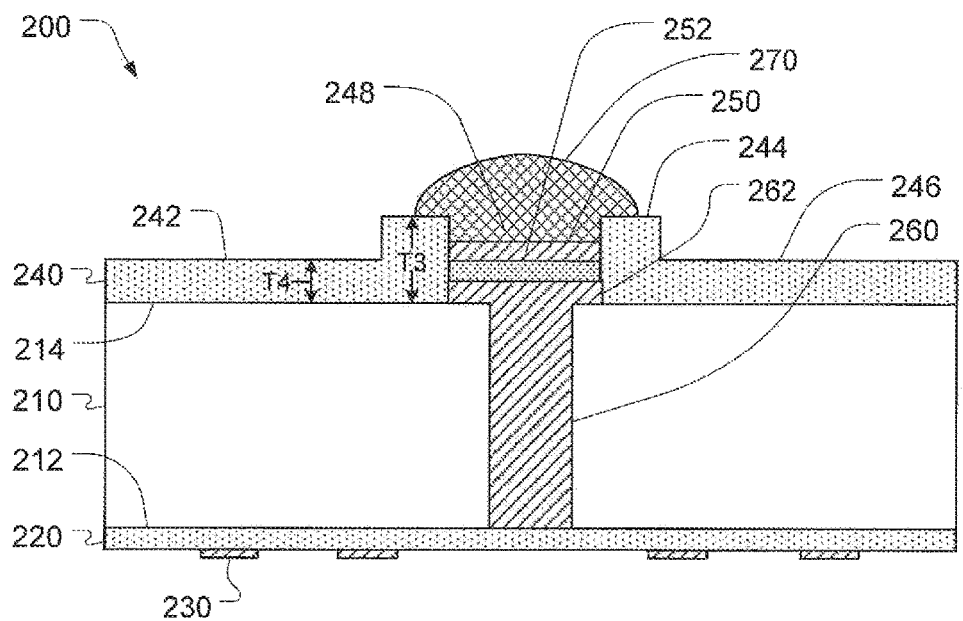
FIG. 2A is a side sectional view illustrating an interconnection element in accordance with another embodiment of the invention.

FIG. 2A shows an interconnection element 200 that is a variation of the interconnection element 100 of FIG. 1A, but having a conductive element 250 disposed only within a recess 248 within the second dielectric layer 240.

As illustrated in FIG. 2A, an interconnection element 200 can include a substrate element 210 having a front surface 212 and a rear surface 214 opposite from the front surface. The interconnection element 200 can also include a first dielectric layer 220 overlying the front surface 212 and having a first surface 222 and a plurality of conductive contacts 230 at the first surface, and a second dielectric layer 240 overlying the rear surface 214 and having a second surface 242 and a conductive element 250 at the second surface. The interconnection element 200 can also include electrically conductive structure between the front and rear surfaces 212, 214, shown in FIG. 2A in the form of a conductive via 260, which can electrically couple the conductive element 250 with one or more of the contacts 230. In the embodiment of FIG. 2A, the conductive via 260 can extend within a through opening 216 extending between the front and rear surfaces 212, 214.

As can be seen in FIG. 2A, the second dielectric layer 240 can have a raised portion 244 having a first thickness T3 between the second surface 242 and the rear surface 214, and a lowered portion 246 having a second thickness T4 between the second surface and the rear surface, the first thickness being greater than the second thickness. The second dielectric layer 240 can define a recess 248 extending below the surface of the raised portion 244, from the second surface 242 toward the rear surface 214. As can be seen in FIG. 2A, the recess 248 may extend completely through the second dielectric layer 244, such that a contact portion 262 coupled to the electrically conductive via 260 at the rear surface 214 is exposed within the recess.

Similar to the embodiment of FIG. 1A, in one example, the second thickness T4 can be zero, such that the second dielectric layer 240 has an opening extending through an entire thickness of the second dielectric layer, thus separating a first raised portion 244 from a second raised portion spaced apart therefrom. In such an embodiment, the raised portions 244 can be a plurality of spaced-apart discontinuous portions of the second dielectric layer 240, rather than raised portions of a continuous second dielectric layer.

As shown in FIG. 2A, the conductive element 250 may be located only within the recess 248 and not extending onto the raised portion 244 or the lowered portion 246. In other words, the conductive element 250 can be entirely located within the recess 248. The conductive element 250 can overlie the contact portion 262 coupled to the electrically conductive via 260. The conductive element 250 may have a circular shape, for example.

Figure 2B:
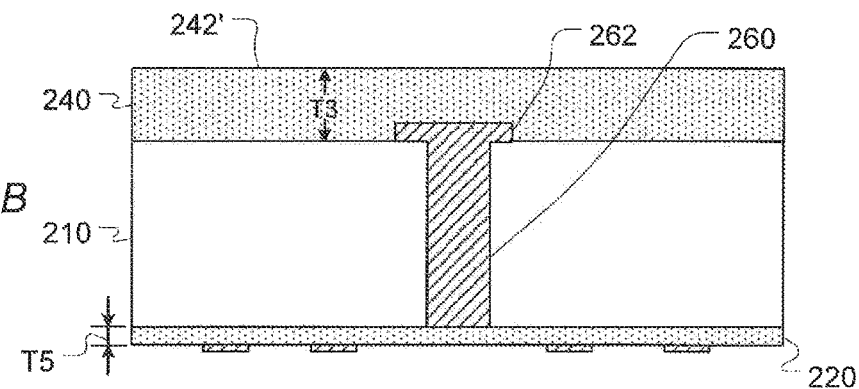
FIGS. 2B-2E are side sectional views illustrating stages of fabrication in accordance with the embodiment depicted in FIG. 2A.

A method of fabricating the interconnection element 200 (FIG. 2A) will now be described, with reference to FIGS. 2B through 2E, the method being a variation of that described above with reference to FIGS. 1A-1H, with only differences pointed out herein. As illustrated in FIG. 2B, the substrate element 210 can initially be provided with a second dielectric layer 240 having a generally uniform initial second surface 242' having an initial thickness T3 between the second surface and the rear surface 214. The substrate element 210 can initially be provided with a first dielectric layer 220 having a first surface 222 having an initial thickness T5 between the first surface and the front surface 212.

Figure 2C:
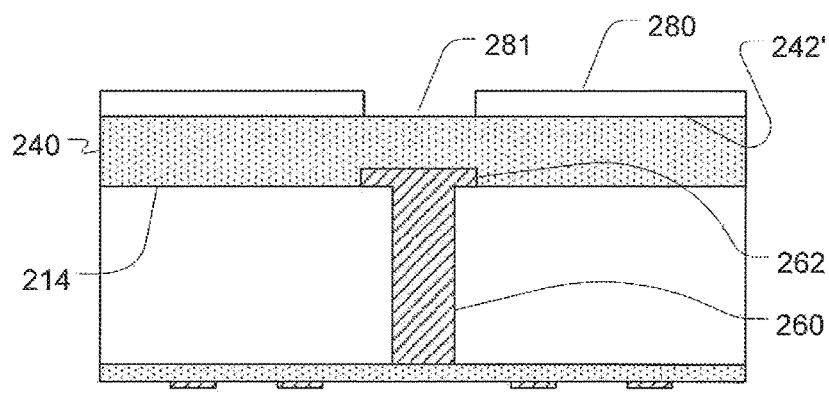

As can be seen in FIG. 2C, a first protective mask 280 can be provided overlying portions of the initial second surface 242' of the second dielectric layer 240. For example, a photoimageable layer, e.g., a photoresist layer, can be deposited and patterned to cover only portions of the initial second surface 242' of the second dielectric layer 240, such that the first mask 280 has gaps 281 aligned with locations where it is desired to form recesses 248, for example, aligned in lateral directions parallel to the rear surface 214 with the contact portions 262 coupled to the electrically conductive vias 260.

Figure 2D:
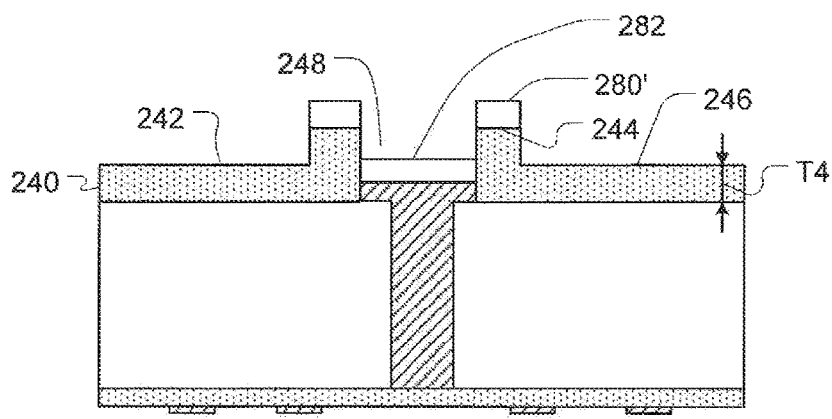

Referring to FIG. 2D, a portion of the second dielectric layer 240 can be removed at locations not covered (i.e., exposed) by the first mask 280, so as to form recesses 248 extending through the second dielectric layer between the initial second surface 242' and the contact portions 262 coupled to the electrically conductive vias 260. In one embodiment, removing of the portion of the second dielectric layer 240 can expose a top surface of the conductive via 260 within the recess 248, which may be a contact portion 262 of the conductive via. The removing of the portion of the second dielectric layer 240 can include etching the portion of the second dielectric layer to be removed. In one example, the removing of the portion of the second dielectric layer 240 can be performed by isotropic etching.

Still referring to FIG. 2D, after the recesses 248 are formed through the second dielectric layer 240, a second mask 282 can be provided within the recesses, over the contact portions 262 coupled to the electrically conductive vias 260. The second mask 280 may protect the contact portions 262 from being damaged during removal of additional portions of the second dielectric layer 240. In one embodiment, the second dielectric mask can comprise a different material than the first dielectric mask.

As can be seen in FIG. 2D, the first mask 280 may be partially removed, such that portions 280' of the first mask remain where it is desired to provide the raised portions 244 of the second dielectric layer, and so that portions of the first mask are removed where it is desired to reduce the thickness of the second dielectric layer, to provide the lowered portions 246.

Figure 2E:
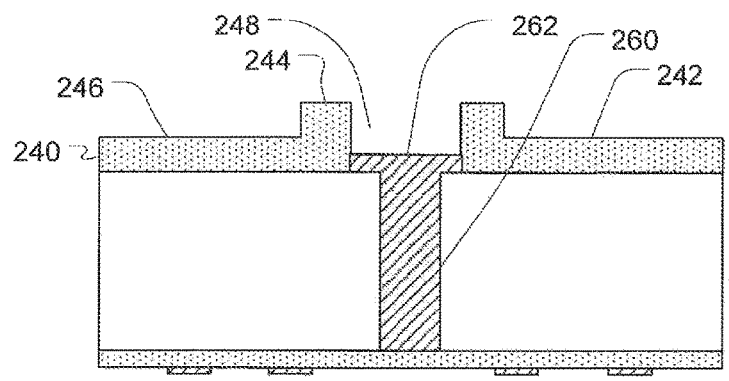

Then, a portion of the second dielectric layer 240 can be removed at locations not covered (i.e., exposed) by the portions 280' of the first mask layer, so as to reduce the thickness of the uncovered locations to the second thickness T4, and to provide the raised portions 244 of the second dielectric layer having the first thickness T3 and the lowered portions 246 having the second thickness T4, the first thickness being greater than the second thickness. The removing of the portion of the second dielectric layer 240 can include etching the portion of the second dielectric layer to be removed. In one example, the removing of the portion of the second dielectric layer 240 can be performed by isotropic etching. As shown in FIG. 2E, after the raised portion 244 and the lowered portion 246 of the second dielectric layer 240 are formed, the remaining portions 280' of the first mask layer and the second mask layer 282 can be removed.

Referring again to FIG. 2A, an electroless nickel immersion gold ("ENIG") coating 252 can be deposited onto the contact portions 262 coupled to the electrically conductive vias 260, only within the recesses 248. Then, the conductive element 250 can be deposited onto the ENIG coating 252, only within the recesses 248.

Next, the electrically conductive bond material 270 can be deposited into the recess 248 extending below the raised portion 244 of the second dielectric layer 240. In the embodiment shown in FIG. 2A, the conductive bond material 270 can be deposited such that it does not contact the raised portion 244 or the lowered portion 246 of the second dielectric layer 260.

Figure 3A:
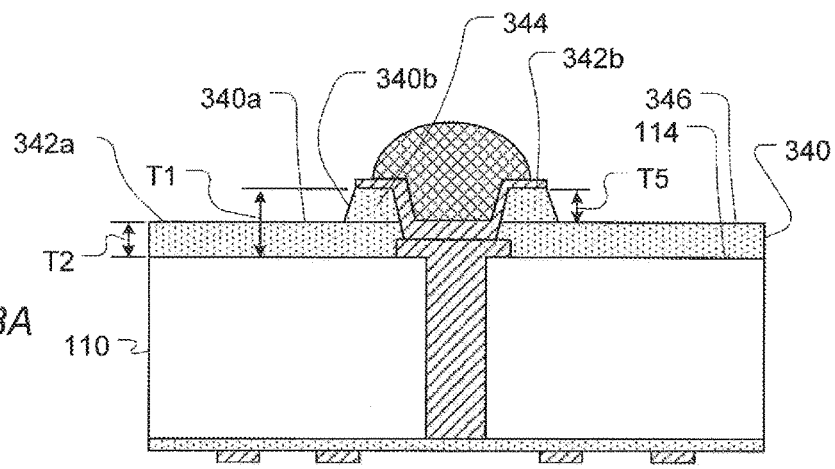
FIG. 3A is a side sectional view illustrating an interconnection element in accordance with another embodiment of the invention.

FIG. 3A shows an interconnection element 300 that is a variation of the interconnection element 100 of FIGS. 1A-1F. The interconnection 300 is the same as the interconnection element 100, except that the second dielectric layer 340 comprises two dielectric layers made of different materials. The second dielectric layer 340 can include a lower dielectric layer 340a overlying the rear surface 114 of the substrate element 110 and an upper dielectric layer 340b overlying the lower dielectric layer. The lower dielectric layer 340a can have a thickness of T1 between the rear surface 114 and a first exposed surface 342a of the lower dielectric layer. The upper dielectric layer 340b can have a thickness of T5 between the first exposed surface 342a of the lower dielectric layer and a second exposed surface 342b of the upper dielectric layer. Together, the lower and upper dielectric layers 340a, 340b can have a thickness of T1 between the rear surface 114 and the second exposed surface 342b of the upper dielectric layer.

In one example, the lower and upper dielectric layers 340a, 340b can each be polymers. In one embodiment, the lower dielectric layer 340a can comprise silicon dioxide or another oxide or organic material, and the upper dielectric layer 340b can comprise polyamide. In a particular example, the lower dielectric layer 340a can comprise a compliant material, such as a polymeric material (e.g., silicone), and the Young's modulus of the lower dielectric layer can be lower than the Young's modulus of the material of the upper dielectric layer 340b. For example, the Young's modulus of the material of the lower dielectric layer 340a can be less than 3 GPa.

Figure 3B:
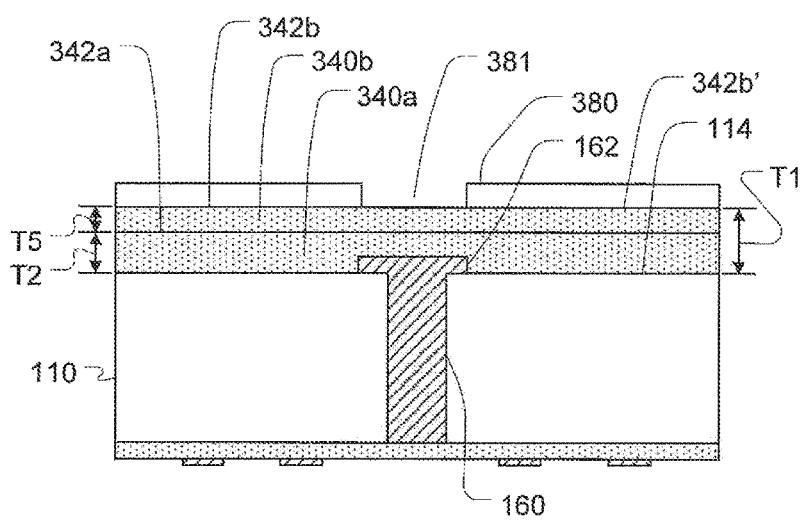
FIGS. 3B and 3C are side sectional views illustrating stages of fabrication in accordance with the embodiment depicted in FIG. 3A.

A method of fabricating the interconnection element 300 (FIG. 3A) will now be described, with reference to FIGS. 3B and 3C, the method being a variation of that described above with reference to FIGS. 1A-1H, with only differences pointed out herein. As illustrated in FIG. 3B, the lower dielectric layer 340a can be deposited onto the rear surface 114 of the substrate element 110, and the upper dielectric layer 340b can be deposited onto the first exposed surface 342a of the lower dielectric layer.

The upper and lower dielectric layers 340a, 340b can each have a generally uniform respective initial thickness T2, T5. In one example, the lower dielectric layer 340a can be deposited (e.g., spin-coated) onto the rear surface 114, and after the lower dielectric layer 340a is fully cured, the upper dielectric layer 340b can be deposited (e.g., spin-coated) onto the lower dielectric layer. In a particular embodiment, the lower dielectric layer 340a can cover the contact portions 162 coupled to the electrically conductive vias 160.

Then, a protective mask 380 can be provided overlying portions of the initial second exposed surface 342b' of the upper dielectric layer 340b. For example, a photoimageable layer, e.g., a photoresist layer, can be deposited and patterned to cover only portions of the initial second exposed surface 342b' of the upper dielectric layer 340b, such that the mask 380 has gaps 381 aligned with locations where it is desired to form recesses 348, for example, aligned in lateral directions parallel to the rear surface 114 with the contact portions 162 coupled to the electrically conductive vias 160.

Figure 3C:
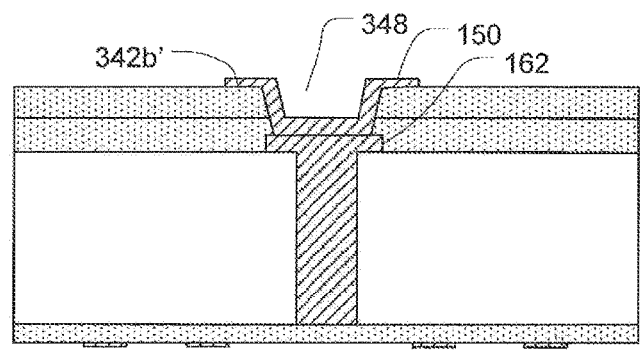

Referring to FIG. 3C, a portion of both the lower and upper dielectric layers 340a, 340b can be removed at locations not covered (i.e., exposed) by the mask 380, so as to form recesses 348 extending through the second dielectric layer 340 between the initial second exposed surface 342b' and the contact portions 162 coupled to the electrically conductive vias 160. In one example, the removing of the portion of the upper dielectric layer 340b can be performed by wet etching, and the removing of the portion of the lower dielectric layer 340a can be performed by reactive ion etching.

After the recess 348 is formed extending through the second dielectric layer 340, the conductive element 150 can be deposited into the recess and extending onto the initial second exposed surface 342b' of the upper dielectric layer 340b. A mask such as the mask 380 can be used to protect portions of the initial second exposed surface 342b' of the upper dielectric layer 340b at locations where it is not desired to form the conductive elements 150, and then the mask can be removed after the conductive elements are formed.

Then, the upper dielectric layer 340b can be removed at locations not covered by the conductive elements 150, for example, by wet etching, thereby forming the raised portions 344 at the covered locations of initial second exposed surface 342b' of the upper dielectric layer 340b in alignment with the conductive elements 150. In one example, a mask such as the mask 180 can be used to protect the conductive elements 150 during removal of portions of the upper dielectric layer 340b, as shown in FIGS. 1C and 1D. Alternatively, the conductive elements 150 may serve as a mask during removal of portions of the upper dielectric layer 340b, as described above with reference to FIGS. 1A-1H.

In the example shown in FIG. 3A-3C, the upper dielectric layer 340b can be completely removed at locations not covered by the conductive elements 150, and portions of the lower dielectric layer 340a may only be removed at locations where the recesses 348 were formed. In the example shown, the raised portions 344 can comprise portions of the lower and upper dielectric layers 340a, 340b, while the lowered portion 346 can comprise only portions of the lower dielectric layer.

Figure 4:
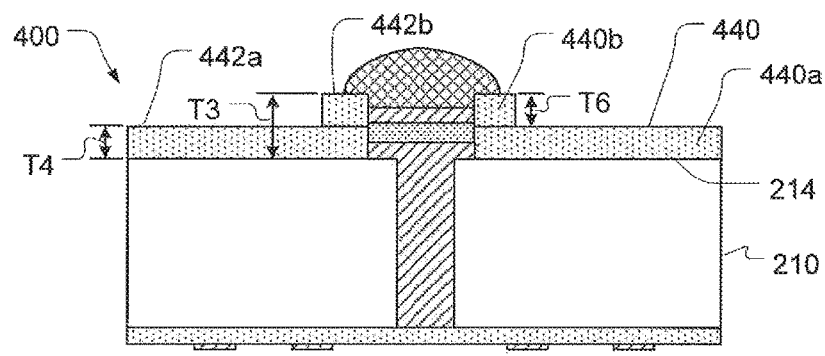
FIG. 4 is a side sectional view illustrating an interconnection element in accordance with another embodiment of the invention.

FIG. 4 shows an interconnection element 400 that is a variation of the interconnection element 100 of FIGS. 2A-2E. The interconnection 400 is the same as the interconnection element 200, except that the second dielectric layer 440 comprises two dielectric layers made of different materials. The second dielectric layer 440 can include a lower dielectric layer 440a overlying the rear surface 214 of the substrate element 210 and an upper dielectric layer 440b overlying the lower dielectric layer. The lower dielectric layer 440a can have a thickness of T4 between the rear surface 214 and a first exposed surface 442a of the lower dielectric layer. The upper dielectric layer 440b can have a thickness of T6 between the first exposed surface 442a of the lower dielectric layer and a second exposed surface 442b of the upper dielectric layer. Together, the lower and upper dielectric layers 440a, 440b can have a thickness of T3 between the rear surface 214 and the second exposed surface 442b of the upper dielectric layer. The method of depositing and etching the lower and upper dielectric layers 440a, 440b overlying the rear surface 214 can be the same as described above with respect to the depositing and etching the lower and upper dielectric layers 340a, 340b of the interconnection element 300 of FIGS. 3A-3C.

Figure 5:
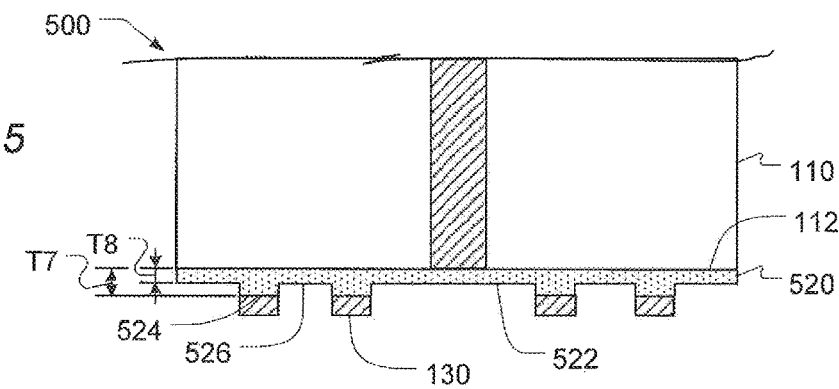
FIG. 5 is a side sectional view illustrating the front side of an interconnection element in accordance with another embodiment of the invention.

FIG. 5 shows a front portion of an interconnection element 500 that can be a variation any of the interconnection elements 100, 200, 300, or 400 of FIGS. 1A-4. The interconnection element 500 is the same as the interconnection element 100 (or 200, 300, or 400) except that the first dielectric layer 520 can have a raised portion 524 having a first thickness T7 between the first surface 522 and the front surface 112, and a lowered portion 526 having a second thickness T8 between the first surface and the rear surface, the first thickness T7 being greater than the second thickness T8. In one example, T7 can be about 1.0 microns, and T8 can be about 0.5 microns. In another example, T7 can be between about 1 microns and about 3 microns, and T8 can be between about 0.5 microns and about 2 microns, with T7 being greater than T8. In a particular embodiment, T8 can be about half or less than about half of the thickness of T7. As shown in FIG. 5, the conductive contacts 130 can overlie the raised portions 524 of the first dielectric layer 520, and the lowered portions 526 can extend between adjacent ones of the raised portions. Masking an etching of the first dielectric layer 520 can be performed in the same ways disclosed above with respect to any of the interconnection elements 100, 200, 300, or 400 of FIGS. 1A-4.

Similar to the raised and lowered portions 144, 146 of the interconnection element 100, the, in some embodiments, removal of one or more portions of the first dielectric layer 520 can be performed such that the second thickness T8 is zero, and the first dielectric layer 520 has an opening extending through its entire thickness. In this way, a first raised portion 524 and a second raised portion 524 can be spaced apart from one another with the opening between them. In such an embodiment, the raised portions 524 can be a plurality of spaced-apart discontinuous portions of the first dielectric layer 520, rather than raised portions of a continuous second dielectric layer.

Furthermore, similar to the configuration shown in FIG. 1G, the first dielectric layer 520 of the interconnection element 500 can include a plurality of spaced-apart raised portions 524, each underlying a corresponding conductive contact 130, with a lowered portion 526 extending between adjacent ones of the raised portions. As indicated above, the lowered portion 526 may have a thickness T8 of zero in one example, or a constant thickness T8 that is a percentage, e.g., 5% to 95%, of the thickness T7 of the raised portions 524.

Similar to FIG. 1H, the first dielectric layer 520 of the interconnection element 500 can include one or more raised portions 524 that continuously extend between at least two adjacent ones of the conductive contacts 130. At least some adjacent ones of the conductive contacts 130 can be separated by a lowered portion 526. The interconnection element 500 may have a plurality of spaced-apart lowered portions 526 extending within a continuous raised portion 524. Again, the lowered portions 526 can have a thickness T8 of zero or a constant thickness T8 that is a percentage of T7.

Figure 6:
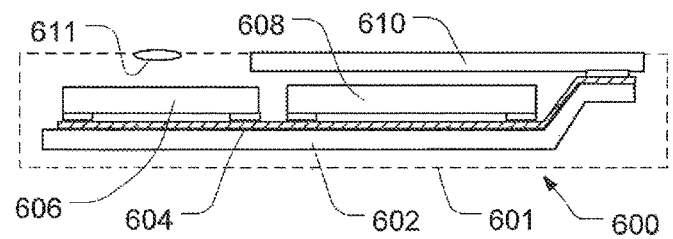
FIG. 6 is a schematic depiction of a system according to one embodiment of the invention.

The interconnection elements described above with reference to FIGS. 1A through 5 above can be utilized in construction of diverse electronic systems, such as the system 600 shown in FIG. 6. For example, the system 600 in accordance with a further embodiment of the invention includes a plurality of modules or components 606 such as the interconnection elements described above, in conjunction with other electronic components 608, 610 and 611.

In the exemplary system 600 shown, the system can include a circuit panel, motherboard, or riser panel 602 such as a flexible printed circuit board, and the circuit panel can include numerous conductors 604, of which only one is depicted in FIG. 6, interconnecting the modules or components 606, 608, 610 with one another. Such a circuit panel 602 can transport signals to and from each of the interconnection elements, microelectronic packages and/or microelectronic assemblies included in the system 600. However, this is merely exemplary; any suitable structure for making electrical connections between the modules or components 606 can be used.

In the example depicted in FIG. 6, the component 608 is a semiconductor chip and component 610 is a display screen, but any other components can be used in the system 600. Of course, although only two additional components 608 and 611 are depicted in FIG. 6 for clarity of illustration, the system 600 can include any number of such components.

Modules or components 606 and components 608 and 611 can be mounted in a common housing 601, schematically depicted in broken lines, and can be electrically interconnected with one another as necessary to form the desired circuit. The housing 601 is depicted as a portable housing of the type usable, for example, in a cellular telephone or personal digital assistant, and screen 610 can be exposed at the surface of the housing. In embodiments where a structure 606 includes a light-sensitive element such as an imaging chip, a lens 611 or other optical device also can be provided for routing light to the structure. Again, the simplified system shown in FIG. 6 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of processing an interconnection element, comprising:
    providing a substrate element having front and rear opposite surfaces and electrically conductive structure, a first dielectric layer overlying the front surface and a plurality of conductive contacts at a first surface of the first dielectric layer, and a second dielectric layer overlying the rear surface and having a second surface, the second dielectric layer having a first thickness;
    removing a portion of the second dielectric layer so as to reduce the thickness of the portion to a second thickness, thereby forming a raised portion of the second dielectric layer having the first thickness and a lowered portion of the second dielectric layer having the second thickness, the first thickness being greater than the second thickness;
    forming a recess within the raised portion of the second dielectric layer extending from the raised portion of the second dielectric layer toward the rear surface; and
    then forming a conductive element in the recess, the conductive element electrically coupled with the electrically conductive structure, the conductive element not contacting or overlying the lowered portion.

2. The method as claimed in claim 1, wherein the substrate element has a first coefficient of thermal expansion ("CTE") in a plane parallel to the rear surface of less than 8 ppm/° C., and the second dielectric layer has a second CTE in a plane parallel to the rear surface of greater than 12 ppm/° C.

3. The method as claimed in claim 1, further comprising providing an electrically conductive bond material on a portion of the conductive element that extends below the height of the first thickness of the second dielectric layer.

4. The method as claimed in claim 1, wherein the plurality of conductive contacts extend a first distance above the front surface, the method further comprising removing a portion of the first dielectric layer so that a portion of the first surface is lowered to a second distance above the front surface, the first distance being greater than the second distance.

5. The method as claimed in claim 1, further comprising juxtaposing element contacts at a face of a microelectronic element with the plurality of conductive contacts, and joining the element contacts with the conductive contacts.

6. The method as claimed in claim 1, wherein the electrically conductive structure includes one or more electrically conductive traces underlying at least part of the raised portion of the second dielectric layer.

7. The method as claimed in claim 1, wherein the conductive element is formed only within the recess.

8. The method as claimed in claim 7, further comprising, before forming the conductive element, applying an electroless nickel immersion gold coating within the recess, wherein the conductive element is formed on the coating.

9. The method as claimed in claim 7, further comprising, before the removing, depositing a first dielectric mask overlying covered locations of the second dielectric layer, wherein the removing includes etching the portion of the second dielectric layer, the portion of the second dielectric layer being exposed by the first dielectric mask.

10. The method as claimed in claim 9, wherein the substrate element has a through opening extending between the front and rear surfaces, and the electrically conductive structure includes a conductive via extending within the opening, and the removing exposes a top surface of the conductive via within the recess.

11. The method as claimed in claim 10, further comprising, before depositing the first dielectric mask, depositing a second dielectric mask on at least a portion of the top surface of the conductive via, the second dielectric mask comprising a different material than the first dielectric mask.

12. The method as claimed in claim 1, wherein the second thickness is zero.

* * * * *